US00RE35753E

United States Patent [19]

Raab et al.

[11] E Patent Number: Re. 35,753

[45] Reissued Date of Patent: Mar. 24, 1998

[54] OPTICAL LITHOGRAPHICAL IMAGING SYSTEM INCLUDING OPTICAL TRANSMISSION DIFFRACTION DEVICES

[75] Inventors: Eric L. Raab, Teaneck; Sheila Vaidya, Watchung; Donald L. White, Morris Plains, all of N.J.

[73] Assignee: Lucent Technologies Inc., Murray Hill, N.J.

[21] Appl. No.: 648,796

[22] Filed: May 16, 1996

Related U.S. Patent Documents

Reissue of:

[64] Patent No.: 5,320,918
Issued: Jun. 14, 1994
Appl. No.: 29,749
Filed: Mar. 11, 1993

U.S. Applications:

[63] Continuation-in-part of Ser. No. 999,064, Dec. 31, 1992, abandoned.

[51] Int. Cl.[6] ..... G03F 9/00

[52] U.S. Cl. ..... 430/4; 430/5

[58] Field of Search ..... 430/4, 5

[56] References Cited

U.S. PATENT DOCUMENTS 4,738,910 4/1988 Ito et al. ..... 430/322
5,418,092 5/1995 Okamoto ..... 430/5

FOREIGN PATENT DOCUMENTS 0486316 5/1992 European Pat. Off. .

OTHER PUBLICATIONS

Soc. of Photooptical Instrumentation Engineers (SPIE), R. Pforr et al., "A New Resolution Enhancement Mask for Projection Lithographic Based on In–Situ Angular Illumination", Aug. 24, 1992.

Soc. of Photooptical Instrumentation Engineers (SPIE), H. Kang et al., "A New Method of Tilted Illumination Using Grating Mask", Aug. 24, 1992.

"193–nm Step–and–Scan Illuminator" Excimer Direct Processing Program; The Meeting of the Advisory Panel, Lincoln Laboratory, Massachusetts Institute of Technology, Dec. 14, 1992.

Soc. of Photooptical Instrumentation Engineers (SPIE), Y. Oh et al., "A New Mask Technique for Optical Lithography", Aug. 24, 1992.

*Primary Examiner*—Hoa Van Le

*Attorney, Agent, or Firm*—David I. Caplan; Richard J. Botos

[57] ABSTRACT

In an optical lithographical system (e.g., 100) for printing features of a patterned mask (e.g., 103) into a workpiece (e.g., 120), such as in a semiconductor device, a one- or two-dimensional (depending on the features of the mask) optical transmission phase-shift diffracting device (e.g., 107) is inserted between an optical condensor (e.g., 105) and the patterned mask whose features are to be printed into the workpiece. The diffracting device is designed so as to enable an imaging lens system (e.g., 102) to collect more than merely a single order of the resulting diffraction patterns of the features of the mask and, by varying the spatial periodicity of the diffracting device, to tailor the illumination incident on the mask in accordance with the features (e.g., 114, 115) of the mask.

18 Claims, 3 Drawing Sheets

OPTICAL LITHOGRAPHICAL IMAGING SYSTEM INCLUDING OPTICAL TRANSMISSION DIFFRACTION DEVICES

Matter enclosed in heavy brackets [ ] appears in the original patent but forms no part of this reissue specification; matter printed in italics indicates the additions made by reissue.

CROSS-REFERENCE TO RELATED APPLICATION

This application is a Continuation-in-Part application of E. L. Raab et al. 1-21-33, Ser. No. 07/999064, filed Dec. 31, 1992, now abandoned.

TECHNICAL FIELD

This invention relates to optical lithography and more particularly to such systems that include (patterned) lithographic masks. The masks are also called "reticles".

BACKGROUND OF THE INVENTION

An optical lithographic fabrication system is used in prior art for delineating features in a workpiece. Typically the workpiece comprises a semiconductor wafer (substrate), together with one or more layers of material(s) (not shown) located on a top major surface of the wafer.

During operation of the optical lithographical system, typically monochromatic optical radiation of wavelength $\lambda$ is emitted by an optical source, such as a mercury lamp. This radiation propagates successively through an aperture in an opaque screen, an optical condensor such as an optical condensing lens (or condensing lens system), a lithographic mask or reticle, and an optical imaging lens or imaging lens system. The optical radiation emanating from the reticle is focused by the imaging lens onto a photoresist layer located on the top major surface of the workpiece. Thus, the pattern of the mask—that is, the pattern of its transparent and opaque portions—is imaged on the photoresist layer.

The mask or reticle illustratively includes a uniformly thick, optically transparent substrate, typically made of glass. On the underside (bottom surface) of this transparent substrate is located a patterned opaque layer, typically made of chromium, having two illustrative portions: (1) an illustrative portion which is suitable for forming an image comprising an isolated circular or an isolated square bright spot (localized area) on the photoresist layer, and (2) another illustrative portion which is composed of mutually parallel opaque stripes suitable for forming an image comprising mutually parallel lines and spaces on the photoresist layer. The illustrative portion which is suitable for forming the isolated bright spots typically is composed of an opaque solid layer having an isolated circular or isolated square aperture in it.

Depending upon whether the photoresist layer comprises negative or positive resist material, when it is subjected to a development process, typically a wet developer, the material of the photoresist respectively remains or is removed at, and only at, areas on which the optical radiation was incident. Thus, the pattern of the mask is transferred to the photoresist layer, whereby a patterned photoresist layer is formed.

Subsequent etching process, such as wet etching or dry plasma etching, can then remove portions of the workpiece in accordance with the pattern of the photoresist layer and hence in accordance with the pattern of the mask. That is to say, portions of the workpiece are removed from the top surface of the workpiece at areas underlying those regions where the material of the photoresist layer was removed by the development process but not at areas underlying those regions where the photoresist remains. Alternatively, instead of etching the workpiece, impurity ions can be implanted into the workpiece at areas underlying those regions where the photoresist was removed by the development process but not at areas underlying those regions where the photoresist remains. In accordance with yet another alternative, such as a "lift-off" process, metallization can be deposited or otherwise formed on the workpiece only at areas underlying those regions where the photoresist was removed. Thus, in any event, the pattern of features of the mask—i.e., each feature of the mask such as the above-mentioned parallel lines and spaces as well as the isolated aperture—ultimately is transferred to the workpiece. Such pattern transfer is desired, for example, in the art of semiconductor integrated circuit fabrication.

In fabricating such circuits, it is desirable, for example, to have as many transistors per wafer as possible. Hence, it is desirable to have as small a transistor or other feature size as possible, such as the feature size of a metallization stripe—i.e., its transverse width—or of an aperture in an insulating layer which is to be filled with metal, for example, in order to form electrical connections between one level of metallization and another or to form metallization lines.

When the size of a feature on the mask is made to be so small that the imaging lens system collects the zero'th order of the diffraction pattern of the feature but collects relatively little of the first order of the diffraction pattern of the feature, then a problem arises in that the edges, including corners, of the image of the feature on the photoresist become indistinct, and therefore very small features undesirably are not printed. Hence the optical contrast of the feature as focused as an optical image on the photoresist layer and transferred to the workpiece deteriorates. As is well known, this lower optical contrast results in a poorer resolution of the feature by the photoresist layer. In practice, this problem typically arises when the size of the feature on the mask is smaller than approximately $(0.7)\lambda/(NA)$, where NA is the numerical aperture on the mask side ("object side") of the imaging lens. Typically this NA is approximately equal to 0.1 in case the magnification m is in the approximate range of 0.20 to 0.25. Also, the depth of focus of features of the mask as imaged on the photoresist layer is often limited to values than can be lower than are desirable from the standpoint of desired resolution.

SUMMARY OF THE INVENTION

In order to improve the contrast and hence the resolution, as well as to increase the depth of focus, a one-dimensional or a two-dimensional optical transmission diffraction device is inserted between the optical condensor and the patterned mask in the above-described optical lithographical system. The diffracting device is, in one embodiment, a transmission diffracting device having a set of relatively thick transparent regions with a set of boundaries running parallel to one direction on a transparent substrate. By "transparent" is meant optically transparent with respect to radiation of the wavelength $\lambda$ to be used in the lithographic system. Alternatively, the device has first and second (or more) sets of transparent regions, each of the regions in the first set having boundaries running parallel to a first spatial direction, and each of the regions in the second set having boundaries running parallel to a second spatial direction that is not parallel to the first direction. In another alternative embodiment the one-dimensional optical diffracting device advantageously can be, at least in a localized area thereof that is to overlie mutually parallel features (lines and spaces) in the pattern of the mask, an array of parallel alternating opaque and transparent stripes (i.e., a one-dimensional transmission grating). Moreover, two-dimensional diffracting device can be, at least in a localized area thereof, a cross-grating (i.e., one set of parallel transparent stripes oriented at a prescribed angle with respect to another set of parallel transparent stripes located on an opaque coating on a transparent substrate). It is also advantageous that the diffracting device be designed such that the imaging lens system collects not only the zero'th order of each of the diffraction patterns of each of the features of the mask but also either the +1 or the −1 order of each of these diffraction patterns. It is also advantageous that all the thick regions have thicknesses that are uniform and are mutually equal, each of these thick regions typically supplying a phase shift equivalent $n\pi$ radian, where n is an odd integer.

It is also advantageous, in a specific embodiment, that at least some of the thick transparent regions form an array of concentric circular rings. It is also advantageous in a specific embodiment that the two non-parallel spatial directions are mutually perpendicular and that an area of the diffracting device form a checkerboard pattern of thick regions. It is also advantageous in another specific embodiment that the thick regions form at least first and second sets of elongated stripes, all the stripes in the first set running perpendicular to all the stripes in the second set. It is also advantageous in another specific embodiment that the thick regions form at least two sets of elongated stripes running in at least two non-parallel spatial directions, respectively. It is also advantageous in another specific embodiment that the thick regions form at least three sets of elongated stripes running in three mutually non-parallel spatial directions, respectively.

It is also advantageous in another specific embodiment that the diffracting device is divided into a pattern of squares or rectangles each of which contains a multiplicity of thick regions in the form of stripes running along but one of a plurality, preferably more than two, of different possible spatial directions.

It is also advantageous in yet another specific embodiment that the diffracting device is divided into different areas in which the sizes of squares in the checkerboard pattern, or the distances between neighboring elongated stripes, are different in different areas. It is also advantageous in yet another specific embodiment, optionally in addition to the sizes of the square being different in different areas, that each square contains a fine structure of thick regions in the form of elongated parallel stripes, and that in any square these stripes all run in one of at least two or more different directions.

It is further advantageous that the spatial periodicity P of the diffracting device varies from (localized) area to (localized) area of the diffracting device in an increasing or decreasing manner, respectively, in accordance the respective increasing or decreasing sizes of features located on the patterned mask in the immediate neighborhood of the respective areas of the diffracting device. It is also advantageous that, in addition to the spatial periodicity P varying from localized area to localized area of the diffracting device, the orientation and shapes of the thick regions of the diffracting device should vary in such a manner from area to area so as to optimize the resolution of the features located in the respective neighborhoods of the respective areas of the mask. It is also advantageous that the diffracting device is a structure that is physically separate and distinct from the patterned mask: for example, the diffracting device is a transparent substrate formed by transparent parallel slab on one of whose major surface the thick regions have been deposited, this slab being a separate body from another transparent slab that forms a substrate of the patterned mask.

This invention also involves a photolithographic method of printing (i.e., transferring) a pattern of features into a workpiece, in accordance with a pattern of features of a patterned mask, comprising the steps of (a) directing optical radiation onto the condensor, through the diffraction device, and through the mask, while focusing the optical radiation emanating from the mask onto a photoresist layer located on a workpiece, whereby an optical image of the mask is formed on the photoresist layer;

(b) developing the photoresist layer, whereby a feature is formed therein in accordance with the image of the mask; and (c) transferring into the workpiece the feature in the photoresist layer.

Only for the sake of clarity, none of the drawings is to scale. The shaded areas in FIGS. 2, 3, 4, and 5 represent relatively thick regions of the respective diffracting devices, typically supplying phase shifts equivalent to $n\pi$ radian, where n is an odd integer.

DETAILED DESCRIPTION

Figure 1:
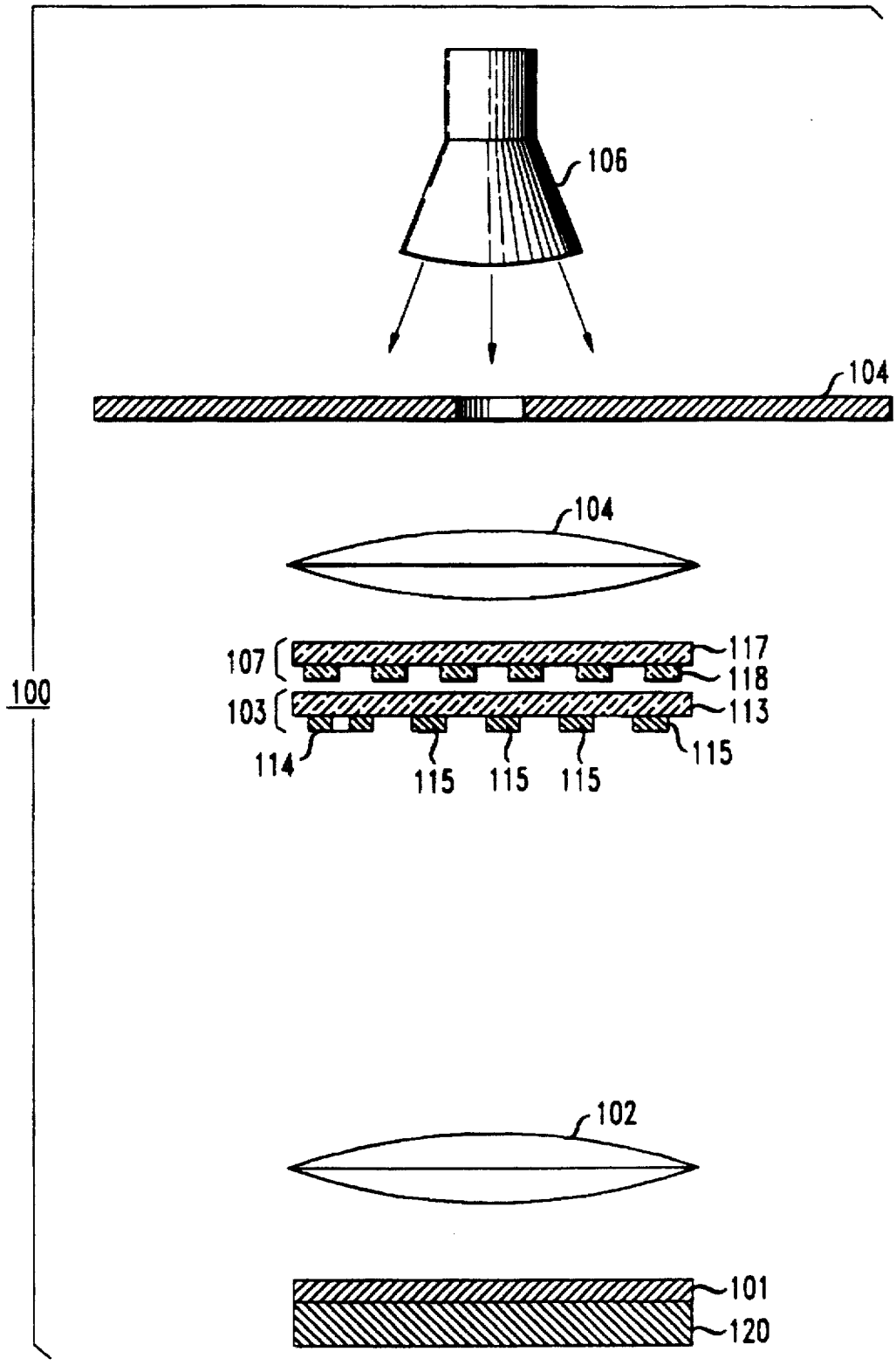
FIG. 1 shows an optical lithographic system, partly in cross section, in accordance with the invention.

Referring now to the drawing, FIG. 1 shows a typical optical lithographic fabrication system 100 suitable for delineating (printing) features in a workpiece 120 such as a semiconductor wafer.

During operation of the system 100 typically monochromatic optical radiation of wavelength $\lambda$ is emitted by an optical source 106, such as a mercury lamp. This radiation propagates successively through an aperture in an opaque screen 105, an optical condensor such as an optical condensing lens (or condensing lens system) 104, a lithographic mask or reticle 103, and an optical imaging lens or lens system 102. The optical radiation emanating from the reticle 103 is focused by the lens 102 onto a photoresist layer 101 located on the top major surface of the workpiece 120. Thus, the pattern of the mask 103—that is, the pattern of its transparent and opaque portions—is imaged on the photoresist layer 101.

The mask or reticle 103 illustratively includes a uniformly thick transparent substrate 113, typically made of glass. On the underside (bottom surface) of this transparent substrate 103 is located a patterned opaque layer, typically made of chromium, having two illustrative portions: (1) a portion 114 which is suitable for forming an image comprising an isolated circular or an isolated square bright spot on the photoresist layer 101, and (2) another portion which is composed of mutually parallel elongated opaque stripes 115 suitable for forming an image comprising mutually parallel lines and spaces on the photoresist layer 101. The portion 114 typically is composed of an opaque solid layer having an isolated circular or an isolated square aperture in it.

Depending upon whether the photoresist layer 101 comprises negative or positive resist material, when it is subjected to a development process, typically a wet developer, the material of the photoresist respectively remains or is removed at, and only at, areas on which the optical radiation was incident. Thus, the pattern of the mask is transferred to the photoresist layer 101, whereby a patterned photoresist layer is formed.

Subsequent etching processes, such as wet etching or dry plasma etching, can then remove portions of the workpiece 120 in accordance with the pattern of the photoresist layer 101 and hence in accordance with the pattern of the mask 103. That is to say, portions of the workpiece 120 are removed from the top surface of the workpiece 120 at areas underlying those regions where the material of the photoresist layer 101 was removed by the development process but not as areas underlying those regions where the photoresist remains. Alternatively, instead of etching the workpiece, impurity ions can be implemented into the workpiece 120 at areas underlying those regions where the photoresist was removed by the development process but not at areas underlying those regions where the photoresist remains. In accordance with yet another alternative, such as a "lift-off" process, metallization can be deposited or otherwise formed on the workpiece 120 only at areas underlying those regions where the photoresist was removed. Thus, in any event, the pattern of features of the mask 103—i.e., each feature of the mask such as the above-mentioned parallel lines and spaces as well as the isolated aperture—is transferred to the workpiece 120. Such pattern transfer is desired, for example, in the art of semiconductor integrated circuit fabrication.

In order to improve optical contrast and hence resolution, as well as to increase the depth of the focus, an optical transmission diffracting device 107 is located between the condensor 104 and the mask 103. This diffracting device 107 is designed so as to enable the imaging lens 102 to collect more than merely the zero'th order diffraction pattern of each of the features of the mask 113, advantageously to collect the orders of the diffraction pattern of each feature of the mask 113 corresponding to its zero'th and either its +1 or its −1 orders simultaneously. Moreover, the features of the diffracting device 107 advantageously are made to run locally at predetermined angles with respect to the features of the mask 103. For example, a feature in the diffracting device 107 typically is formed by a boundary of a uniformly thick elongated transparent stripe 118 deposited on a uniformly thick transparent substrate 117. Alternatively, the substrate 117 can be an initially parallel transparent slab that has been spatially selectively etched to produce the desired diffracting device 107. Alternatively, the substrate 117 can be an initially parallel transparent slab that has been spatially selectively etched to produce the desired diffracting device 107. In a checkerboard diffracting pattern, such as the device 200 (FIG. 3), for purposes of measuring its periodicity P, the features of the diffracting pattern run at an angle of $+\pi/4$ and $-\pi/4$ radian with respect to boundaries of the thick regions, i.e., with respect to the sides of the squares. Specific embodiments 200, 300, 400, and 500 of the diffracting device 107 are shown in FIGS. 2, 3, 4, and 5, respectively.

Figure 2:
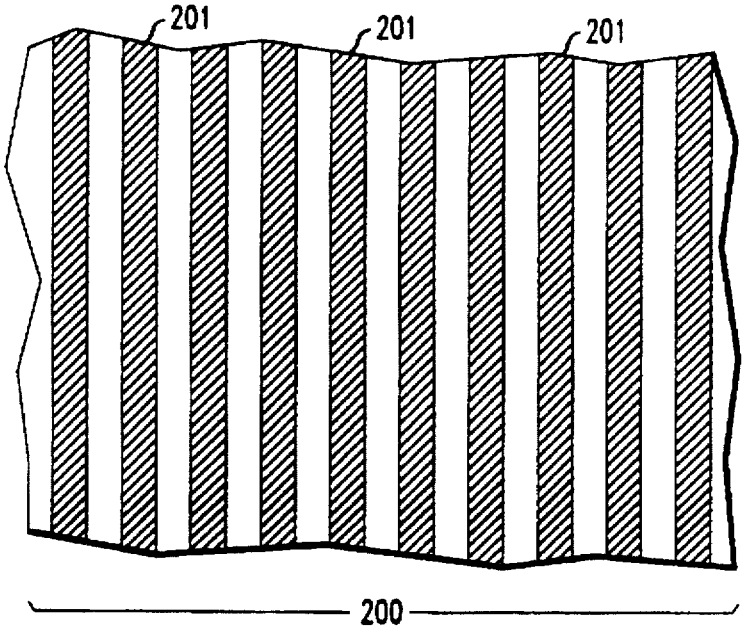
FIG. 2 is a bottom view diagram of a one-dimensional diffracting device for use in the optical system shown in FIG. 1, in accordance with yet another specific embodiment of the invention.

For example, FIG. 2 shows a one-dimensional optical transmission diffraction grating device 200 suitable for use as the diffracting device 107 in the optical lithographical system 100 (FIG. 1). This device 200 comprises an optically transparent substrate slab, typically of quartz, having mutually parallel thick elongated transparent regions 201. Each of these regions 201 has a uniform thickness that is equal to the thicknesses of the others. As used herein, the term "transparent" denotes optically transparent to the optical radiation of wavelength $\lambda$ to be used in the system 100. Typically, the thick regions 201 are formed by chemical vapor deposition of a uniformly thick layer of silicon dioxide followed by lithographic masking and etching of this layer of silicon dioxide.

The thickness of the thus formed relatively thick regions 201 advantageously is selected to be equal to the equivalent of a phase-shift of $n\pi$ radian with respect to the radiation of wavelength $\lambda$, where n is an odd integer preferably equal to one. The distance of separation between the bottom surface of these thick regions 201 and the top surface of the substrate 113 of the mask 103 is typically in the approximate range of between 0.2 cm and 2.0 cm for the sake of uniform illumination of the mask 103.

Instead of the elongated parallel regions 201 being thick and transparent, they can be opaque or other type of parallel grating lines, for example can be formed by means of e-beam writing on the same kind of chromium-covered glass plates used for ordinary mask making, e.g., for making the mask 113.

The grating device 200 is especially useful in conjunction with parallel lines and spaces as features of the mask 103. Advantageously the spatial directions, along which the elongated regions 201 run, vary from area to area on the device 200 so as to run at least approximately parallel to the line and space features of the mask 103 that are located in the respective neighborhoods of the respective areas of the device 200.

The spatial periodicity P of the diffracting device 200 advantageously can be made to vary from area to area on this device 200 in an increasing or decreasing manner in accordance with the respective increasing or decreasing sizes of the (line and space) features of the mask 103 that are located in the respective neighborhoods of those respective areas. In this way, the illumination incident on the mask 103 can be tailored specifically to individual areas of this mask 103 and hence of the photoresist layer 101.

For UV lithography, the widths of the thick regions 201 (or the widths of opaque grating lines) are advantageously in the approximate range of 1.25-to-2.5 microns, as are the distances between neighboring such regions (or the distances being adjacent grating lines); for deep UV lithography, the approximate range is advantageously 0.8-to-2.0 microns.

Figure 3:
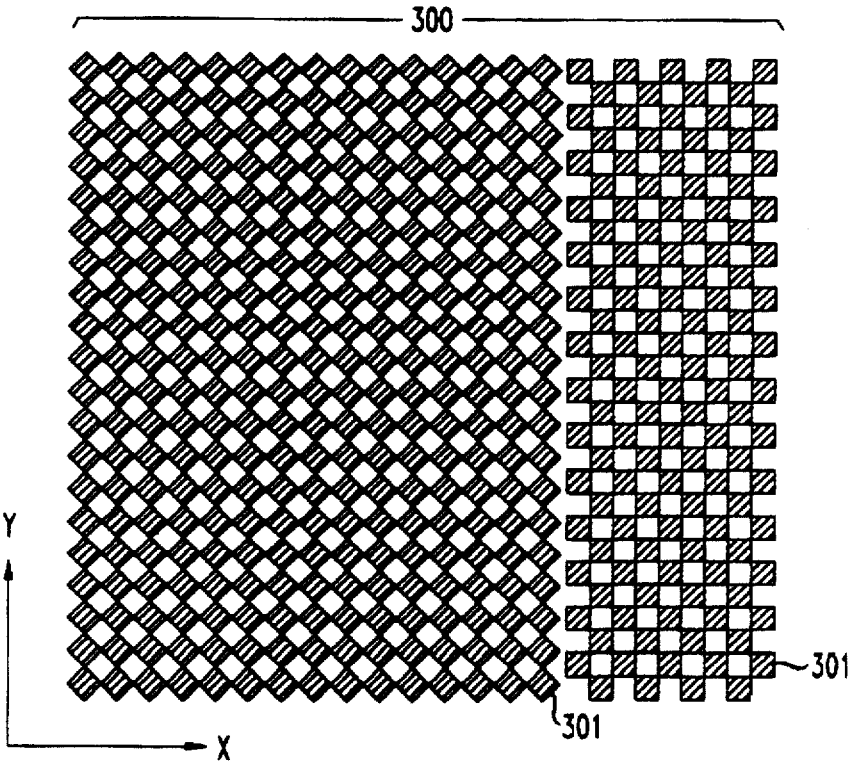
FIG. 3 is a bottom view diagram of a two-dimensional diffracting device for use in the optical system shown in FIG. 1, in accordance with a specific embodiment of the invention.

Referring again to the drawing, FIG. 3 shows a two-dimensional optical transmission diffracting device 300 suitable for use in the optical lithographical system 100 (FIG. 1) as the diffracting device 107. This device 300 is composed of an optically transparent substrate slab, typically of quartz, with thick optically transparent regions 301, each of these regions 301 having a uniform thickness in common with the others. Typically, the thick regions 301 are formed by chemical vapor deposition of a uniformly thick layer of silicon dioxide followed by lithographic masking and etching of this layer of silicon dioxide.

The thickness of the thus formed relatively thick regions 301 advantageously is selected to be equal to the equivalent of a phase-shift of $n\pi$ radian with respect to the radiation of wavelength $\lambda$, where n is an odd integer preferably equal to one. Also, the relatively thick regions 301 thus all have a common thickness. The distance of separation between the bottom surface of these thick regions 301 and the top surface of the substrate 113 of the mask 103 is typically in the approximate range of between 0.2 cm and 2.0 cm for the sake of uniform illumination of the mask 103.

In FIG. 3 the diffracting pattern formed by the thick regions 301 can be divided into two types of areas: one area consisting of a checkerboard pattern of squares that is oriented parallel to the X and Y axes, and another area consisting of a checkerboard pattern of squares that is oriented at an angle of $\pi/4$ radian with respect to the X axis. Advantageously, the respective extents of these areas are selected such that (1) the area whose pattern of squares has boundaries that are oriented parallel to the X axis is placed in the neighborhood of features in the mask 103 that run at an angle of approximately $\pi/4$ radian with respect to the X or Y axis, and (2) the area whose pattern of squares has boundaries that are oriented at an angle of $\pi/4$ radian with respect to the X axis is placed in the neighborhood of features in the mask 103 that runs approximately parallel to the X or Y axis. It should be understood, however, that—depending on the (majority) orientation of the features (lines and spaces, apertures, etc.) of the pattern of the mask 103 in the neighborhood of the area under consideration and on the degree of improvement that is desired in the resolution of the image to be formed on the photoresist layer 101—only one type of these areas is essential; the other can be omitted. Typically, the (equal) lengths of the sides of each of the squares is in the approximate range of between $(0.7)\lambda/(NA)$ and $(3.5)\lambda/(NA)$ preferably in the approximate range of between $(0.8)\lambda/(NA)$ and $(1.7)\lambda/(NA)$, where again NA is the numerical aperture on the mask side of the imaging lens 102. Typically, this numerical aperture (NA) is approximately equal to 0.1.

Instead of the squares (FIG. 3), rectangles can be used.

In FIG. 3 also, the spatial periodicity P of the (checkerboard) pattern of the diffracting device 300 is equal to the distance between the centers of two squares that touch each other at, and only at, a mutual corner; this distance in turn is equal to the length of the diagonal of one of the squares. Moreover, advantageously the diffracting device 300 is located in the system 100 (FIG. 1) such that the distance between the bottom surfaces of the thick regions 301 and the bottom surface of the transparent substrate 113 of the mask 103 are all at least approximately mutually equal and are all within the approximate range of between 100 P and 1000 P.

The spatial periodicity P can be made to vary from area to area on the diffraction device 300 in an increasing or decreasing manner in accordance with the respective increasing or decreasing sizes of the features of the mask 103 located in the immediate neighborhoods of these respective areas. In this way, the illumination striking the mask 103 can be tailored specifically to individual areas of the mask 103 and hence of the photoresist layer 101.

Figure 4:
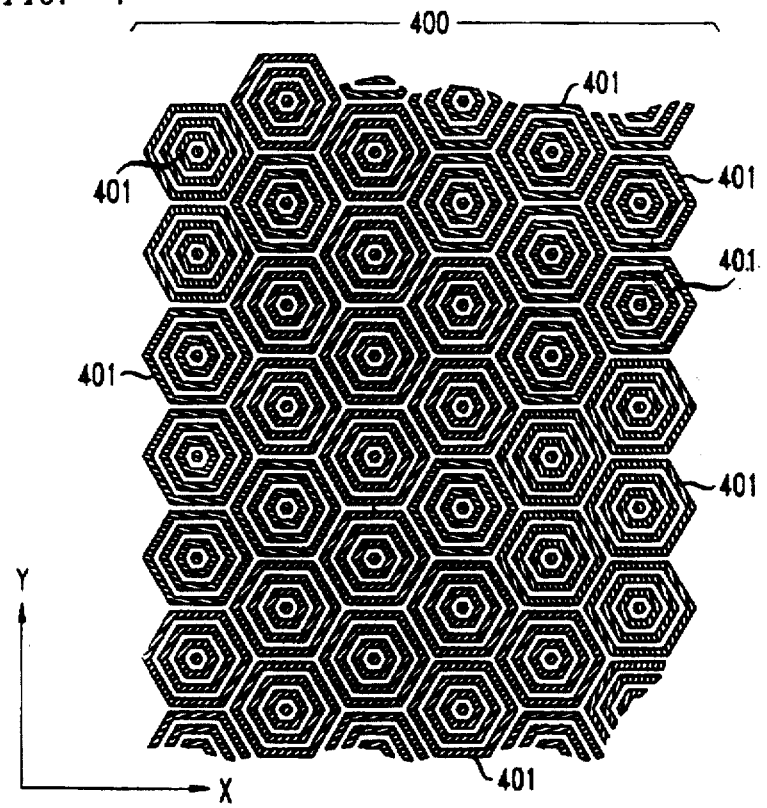
FIG. 4 is a bottom view diagram of a two-dimensional diffracting device for use in the optical system shown in FIG. 1, in accordance with another specific embodiment of the invention.

FIG. 4 shows a two-dimensional optical transmission diffracting device 400 suitable for use as the diffracting device 107 in the optical lithographical system 100 (FIG. 1), in accordance with another embodiment of the invention. This diffracting device 400 has relatively thick region segments 401 and, except for the hexagonal elongated stripe shape of these thick region segments 401, is similar in all (other) respects to the above-described diffraction device 300.

As indicated in FIG. 4, the pattern of the diffracting device 400 is formed by a two-dimensional array of the segments 401, each of which is a relatively thick region as compared with the remainder of the device 400. Except for the central hexagon, the segments 401 run parallel to three different directions that are oriented at angles that are approximately equal to 0, $\pi/3$, and $2\pi/3$ radian, respectively, with respect to the X axis.

As further indicated in FIG. 4, a hexagonal ring is formed by each group of a plurality of six connected segments 401. A plurality of concentric rings forms an overall hexagon, and a closely packed array of overall hexagons is formed by the overall hexagons. Although the drawing (FIG. 4) indicates a plurality of only three rings per overall hexagon, advantageously the number of such rings per overall hexagon is in the approximate range of between five and ten. Advantageously also, the widths of all the six line segments in every ring are equal to one another and to the spaces between neighboring rings. The mutually equal distances between centers of neighboring parallel segments 401 are advantageously in the approximate range of between $\lambda/(NA)$ and $5\lambda/(NA)$, where again (NA) is the numerical aperture on the mask side of the imaging lens 102 and is typically approximately equal to 0.1.

In FIG. 4, the spatial periodicity P of the resulting hexagonal close-pack array of the diffracting device 400 is equal to the distance between centers of neighboring overall hexagons. Moreover, advantageously the diffracting device 400 is located in the system 100 (FIG. 1) such that the distances between the bottom surfaces of the thick segments 301 and the bottom surface of the transparent substrate 113 of the mask 103 are all at least approximately mutually equal and are all in the approximate range of between 100 P and 1000 P. Again, the periodicity P can be made to vary, for the same reason as discussed above in connection with FIG. 3.

Instead of the array (FIG. 4) of pluralities hexagonal rings, pluralities of concentric circular rings together with segments of circular rings can be used, an overall circle being formed by a plurality of such concentric circular rings, with the resulting overall circles forming an array that is either hexagonally closely packed or circularly closely packed. The segments of circular rings advantageously occupy the otherwise resulting empty (non-diffracting) spaces located at areas on the diffracting device more remote from centers of the respective circular rings.

Figure 5:
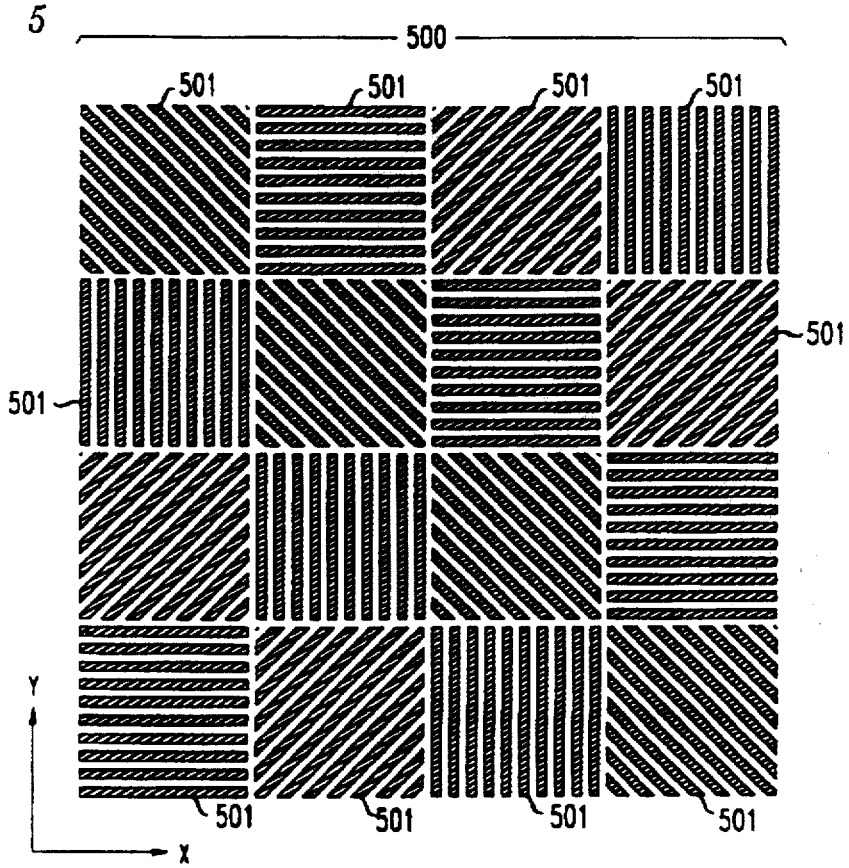
FIG. 5 is a bottom view diagram of a two-dimensional diffracting device for use in the optical system shown in FIG. 1, in accordance with another specific embodiment of the invention.

FIG. 5 shows a two-dimensional optical transmission diffracting device 500 suitable for use as the diffracting device 107 (FIG. 1), in accordance with yet another embodiment of the invention. This diffraction device 500 has relatively thick elongated stripe regions 501 and, except for the elongated stripe shape and orientations of these thick regions 501, is similar in all other respects to the above-described diffracting device 400. In particular, the diffracting device 500 has four different types of areas in each of which the stripes are oriented at approximately 0, $\pi/4$, $\pi/2$, or $3\pi/4$ radian, respectively, with respect to the X axis. Typically, each of the areas is in the form of a square that contains a plurality of stripes: advantageously, for example, between five and ten stripes in each of the areas of the types in which the stripes all run at angles that are approximately equal to 0 or $\pi/2$ radian with respect to the X axis, and between seven and fourteen stripes in each of the other types of areas.

Advantageously, the widths of thick stripe regions 501 are all mutually equal and are equal to the mutually equal spacings between neighboring (parallel) elongated stripe regions 501. Typically, the distance between centers of these neighboring stripe regions 501 is in the approximate range of between $\pi/(NA)$ and $5\pi/(NA)$, where again (NA) is the numerical aperture on the mask side of the imaging lens 102 and is typically approximately equal to 0.1.

In FIG. 5, the spatial periodicity P of the device 500 is, for example, equal to the distance between the centers of two overall squares whose stripes 501 run at $\pi/4$ radian with respect to the X axis and that touch each other at, and only at, a mutual corner; in turn this distance and hence this spatial periodicity P is equal to the length of the diagonal of one of these overall squares. Moreover, advantageously, the diffracting device 500 is located in the system 100 (FIG. 1) such that the distances between the bottom surface of the thick regions 501 and the bottom surface of the transparent substrate 113 of the mask 103 are all approximately mutually equal and are all in the approximate range of between 100 and 1000 P. Again, the periodicity P can vary as discussed above in connection with FIG. 3. Also, in FIG. 5, instead of each square being occupied by a plurality of parallel stripes, each square is occupied by a checkerboard pattern of the kind shown in FIG. 3, the checkerboard pattern within a given square being oriented either parallel to the X axis or at an angle thereto which is approximately equal to $\pi/4$ radian.

Although the invention has been described in detail in terms of specific embodiments, various modifications can be made without departing from the scope of the invention. For example, any of the diffracting devices 200, 300, 400, and 500 can be oriented (i.e., can be "flipped") such that its substrate is located closer to the mask 103 than are its thick regions. Finally, the substrate of the diffracting device 200 can be omitted by forming the grating 201 on the top surface of the substrate 200, and the substrates of the diffracting devices 300, 400, and 500 can likewise be omitted while the thick regions 301, 401, or 501, respectively, can be directly deposited on the top surface of the transparent substrate 113 of the mask 103—all at the expense of processing yield of satisfactory resulting integrated mask devices, and provided, however, that this substrate 113 can be fabricated with a thickness that is compatible with the required distance of separation between the bottom surface of the substrate 113 and the grating 201 or between the bottom surface of the substrate 113 and the bottom surface of the regions 301, 401, or 501, respectively.

We claim:

1. An optical lithographic system comprising: an optical transmission diffracting device located between an optical condensor means and a pattern mask, the optical transmission diffraction grating device being separated from the patterned mask by a distance in the approximate range *of* about 0.2 cm [and] *to* 2.0 cm.

2. The system of claim 1 in which the diffracting device comprises a one-dimensional diffracting device.

3. The system of claim 1 in which the diffracting device comprises a two-dimensional diffracting device.

4. An optical system in accordance with claim 3 in which the diffracting device had a set of relatively thick transparent regions whose boundaries run parallel to one another, and in which all the thick regions have thicknesses that are uniform and are mutually equal.

5. The system of claim 4 in which the diffracting device is located on a substrate that is physically separate and distinct from a substrate on which the pattern mask is located.

6. The system of claim 4 in which the thick regions form at least first and second sets of elongated stripes, all the stripes in the first set running perpendicular to all the stripes in the second set.

7. An optical lithographic system in accordance with claim 1, in which the mask and diffracting device are integrated on a single transparent parallel slab that has first and second major surfaces, on the first major surface of which is located a first pattern of opaque layers in order to form the patterned mask, and on the second major surface of which is located a second pattern of thin and thick transparent regions in order to form the diffraction grating.

8. The system of claim 7, the thick regions forming at least first and second sets of elongated stripes, all the stripes in the first set running perpendicular to all the stripes in the second set.

9. The system of claim 7 in which at least some of the thick regions form a plurality of concentric circular rings.

10. As optical lithographical system in accordance with claim 4, in which the thick regions form at least first and second sets of elongated stripes running in non-parallel first and second spatial directions, respectively.

11. An optical lithographical system in accordance with claim 4 in which the thick regions form at least first, second, and third sets of elongated stripes running in mutually non-parallel first, second, and third spatial directions, respectively.

12. A system in accordance with claim 11 in which the diffracting device has a pattern of squares or rectangles in any one of which the stripes all run in one of the three or more directions.

13. An optical lithographical system in accordance with claim 4 in which the thick regions form at least first, second, third, and fourth sets of elongated stripes running in mutually non-parallel first, second, third, and fourth spatial directions.

14. A system in accordance with claim 13 in which at least a portion of the diffracting device is divided into squares or rectangles in any one of which all the stripes are members of one, and only one, of the sets.

15. A system in accordance with claim 4 in which the thick regions form a checkerboard pattern of squares or rectangles.

16. The system of claim 15 in which the orientation of the squares or rectangles varies from area to area of the diffracting device.

17. An optical lithographical system in accordance with claim 4, 5, 7, 8, 9, 10, 11, 12, 13, 14, 15, or 16, in which the mask has mask feature sizes that vary from area to area of the mask, and in which the diffracting device has a spatial periodicity that varies from area to area of the device in a monotonically increasing or decreasing manner, respectively, in accordance with the respective increasing or decreasing mask feature sizes located in the neighborhoods of the respective areas of the diffracting device.

18. A photolithographic method comprising the steps of (a) directing optical radiation onto the system of claim 1, 4, 6 7, 8, 9, 10, 11, 12, 13, 14, 15, or 16 while focusing the optical radiation emanating from the system onto a photoresist layer located on a workpiece, whereby an optical image of the mask is formed on the photoresist layer;

(b) developing the photoresist layer, whereby a feature is formed therein in accordance with the image of the mask; and (c) transferring into the workpiece the feature in the photoresist layer.

* * * * *